(12) United States Patent
Maehara et al.

(10) Patent No.: US 12,199,409 B2
(45) Date of Patent: Jan. 14, 2025

(54) OPTICAL SEMICONDUCTOR DEVICE AND METHOD OF MANUFACTURING OPTICAL SEMICONDUCTOR DEVICE

(71) Applicant: Mitsubishi Electric Corporation, Tokyo (JP)

(72) Inventors: Hiroaki Maehara, Tokyo (JP); Ayumi Fuchida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 976 days.

(21) Appl. No.: 17/261,560

(22) PCT Filed: Nov. 19, 2018

(86) PCT No.: PCT/JP2018/042689
§ 371 (c)(1),
(2) Date: Jan. 19, 2021

(87) PCT Pub. No.: WO2020/105095
PCT Pub. Date: May 28, 2020

(65) Prior Publication Data
US 2021/0344172 A1    Nov. 4, 2021

(51) Int. Cl.
*H01S 5/223*     (2006.01)
*H01S 5/12*      (2021.01)
*H01S 5/22*      (2006.01)

(52) U.S. Cl.
CPC .............. *H01S 5/223* (2013.01); *H01S 5/124* (2013.01); *H01S 5/2224* (2013.01)

(58) Field of Classification Search
CPC ........ H01S 5/124; H01S 5/223; H01S 5/2277; H01S 5/2205; H01S 5/12; H01S 5/22;
(Continued)

(56) References Cited

U.S. PATENT DOCUMENTS 4,726,031 A * 2/1988 Wakao ............... H01S 5/12
372/96
4,775,980 A * 10/1988 Chinone ............. H01S 5/12
372/102
(Continued)

FOREIGN PATENT DOCUMENTS

EP        0246959 A1 * 11/1987
EP        0498736 A2 *  8/1992
(Continued)

OTHER PUBLICATIONS

International Search Report issued in PCT/JP2018/042689; mailed Feb. 12, 2019.

*Primary Examiner* — Joshua King
(74) *Attorney, Agent, or Firm* — Studebaker & Brackett PC (57) ABSTRACT

There is provided a configuration which includes: a burying layer which has a current narrowing window where portions protruding onto a top part of a ridge stripe are opposed to each other with an interval therebetween narrower than a width of the top part; and a diffraction grating in which a λ/4 phase shifter is placed at an intermediate portion in a light traveling direction; wherein a sectional shape of the current narrowing window varies depending on a position in the light traveling direction so that, at a region where the λ/4 phase shifter is placed, a resistance of a current path from a second cladding layer to a first cladding layer through the current narrowing window is minimum.

8 Claims, 8 Drawing Sheets

(58) Field of Classification Search
CPC ...... H01S 5/2201; H01S 5/2202; H01S 5/227;
H01S 5/1203; H01S 5/1206; H01S
5/1225; H01S 5/1228; H01S 5/1231;
H01S 5/1234; H01S 5/1237
See application file for complete search history.

(56) References Cited

U.S. PATENT DOCUMENTS

| | | | | |
|---|---|---|---|---|
| 4,794,618 A | * | 12/1988 | Mito | H01S 5/12 |
| | | | | 372/102 |
| 4,864,581 A | | 9/1989 | Nelson et al. | |
| 4,894,834 A | * | 1/1990 | Kakimoto | H01S 5/12 |
| | | | | 372/44.01 |
| 4,932,034 A | | 6/1990 | Usami et al. | |
| 4,935,936 A | | 6/1990 | Nelson et al. | |
| 4,984,244 A | * | 1/1991 | Yamamoto | H01S 5/227 |
| | | | | 372/45.01 |
| 5,020,072 A | * | 5/1991 | Abe | H01S 5/11 |
| | | | | 372/102 |
| 5,272,714 A | * | 12/1993 | Chen | H01S 5/12 |
| | | | | 372/96 |
| 5,358,898 A | * | 10/1994 | Ogita | H01S 5/227 |
| | | | | 438/32 |
| 5,818,862 A | | 10/1998 | Salet | |
| 5,878,066 A | * | 3/1999 | Mizutani | H01S 5/12 |
| | | | | 372/27 |
| 2007/0268949 A1 | * | 11/2007 | Takagi | H01S 5/12 |
| | | | | 372/50.11 |
| 2017/0207604 A1 | * | 7/2017 | Watanabe | H01S 5/2272 |

FOREIGN PATENT DOCUMENTS

| | | | | | |
|---|---|---|---|---|---|
| JP | S63-500279 A | | 1/1988 | | |
| JP | 63137496 A | * | 6/1988 | ............. | H01S 5/10 |
| JP | S63153885 A | * | 6/1988 | | |
| JP | S64-011391 A | | 1/1989 | | |
| JP | 01239892 A | * | 9/1989 | ............. | H01S 5/12 |
| JP | H01-231388 A | | 9/1989 | | |
| JP | H02-079486 A | | 3/1990 | | |
| JP | H0632346 B2 | * | 4/1994 | | |
| JP | H09-186401 A | | 7/1997 | | |
| JP | 2001-291930 A | | 10/2001 | | |
| JP | 2011-119098 A | | 6/2011 | | |
| JP | 2017-130657 A | | 7/2017 | | |
| WO | WO-2018125470 A1 | * | 7/2018 | ............. | H01S 5/12 |

* cited by examiner

OPTICAL SEMICONDUCTOR DEVICE AND METHOD OF MANUFACTURING OPTICAL SEMICONDUCTOR DEVICE

TECHNICAL FIELD

The present application relates to an optical semiconductor device and a method of manufacturing the optical semiconductor device.

BACKGROUND ART

A distributed-feedback optical semiconductor device (DFB-LD: Distributed Feed Back Laser Diode) has a waveguide structure in which an active layer is sandwiched by upper and lower cladding layers, and in which one of the cladding layers is doped into an n-type layer and the other one is doped into a p-type layer. When electrodes thereof are energized, holes and electrons are injected from the p-type cladding layer-side and the n-type cladding layer-side, respectively, and are recombined in the active layer to thereby emit light. Further, a resonator is formed by: a reflective mirror which is provided as an interface between an end face in the waveguide in the traveling direction of the light (light traveling direction) and the air as a light outgoing medium; and a diffraction grating.

Although the light having propagated through the inside of the waveguide partly goes out at the end face to cause a mirror loss, the other light is reflected off the end face or the diffraction grating, to thereby propagate again in the waveguide. The diffraction grating is so designed that a region whose phase is shifted by $\lambda/4$ is formed therein, so that only a specific wavelength causes resonance in the resonator. Thus, during propagation in the waveguide, the light obtains a gain and is thus amplified. Then, when the sum of an internal loss during propagation in the waveguide and the mirror loss at the time of end-face reflection becomes equal to the gain obtained during propagation, laser oscillation occurs, so that coherent light is emitted from the end face.

On the other hand, at the time of laser oscillation, light intensities in the active layer in the light traveling direction have a non-uniform distribution, and the light intensity at a portion in the diffraction grating corresponding to the $\lambda/4$-shifted position is highest. At a region where the light intensity is high, a phenomenon referred to as "longitudinal hole burning" occurs in which the carrier density decreases relatively due to stimulated emission thereof, so that there is a problem that a variation in refractive index in the light traveling direction occurs and thus the single mode operation becomes unstable. In this respect, such a laser device is disclosed (see, for example, Patent Document 1) in which an electrode was divided along the light traveling direction into multiple electrodes, and the ratio of currents injected to the respective electrodes is controlled so that the carrier densities in the light traveling direction become close to a uniform state. Furthermore, such an optical semiconductor element is disclosed (see, for example, Patent Document 2) which makes a variation in the resistivity distribution inside the element in the light traveling direction.

CITATION LIST

Patent Document

Patent Document 1: Japanese Patent Application Laid-open No. H01-231388 (Page 3, Upper-right Column, Line to Page 5, Upper-left Column, Line 13; FIG. 2 and FIG. 3)

Patent Document 2: Japanese Patent Application Laid-open No. S64-11391 (Page 3, Upper-right Column, Line 13 to Page 4, Lower-left Column, Line 3; FIG. 4 to FIG. 8)

SUMMARY OF THE INVENTION

Problems to be Solved by the Invention

However, in order to control the ratio of currents injected to the respective divided electrodes, multiple current sources are required, so that the configuration of the device is complicated and operational control thereof becomes complex as well. Further, in order to vary the resistivity inside the element, that is, a resistivity as a material, it is required to precisely control the density distribution of dopant, and this makes manufacturing difficult.

This application discloses a technique to solve the problem as described above, and an object thereof is to provide an optical semiconductor device which is easily capable of stable operation without requiring complex operational control.

Means for Solving the Problems

An optical semiconductor device disclosed in this application is characterized by comprising: a ridge stripe which includes a cladding layer of a first conductivity type, an active layer, and a first cladding layer of a second conductivity type as an opposite conductivity type to the first conductivity type, that are stacked in this order on a surface of a substrate of the first conductivity type; first burying layers by which respective both sides of the ridge stripe are buried while leaving a top part of the ridge stripe exposed; a second burying layer of the first conductivity type which covers the respective first burying layers and has a current narrowing window where portions of the second burying layer that are protruding onto the top part of the ridge stripe are opposed to each other on the top part with an interval therebetween narrower than a width of the tope part; a second cladding layer of the second conductivity type under which the second burying layer of the first conductivity type is buried together with the current narrowing window; and a diffraction grating which is formed in the cladding layer of the first conductivity type or the first cladding layer of the second conductivity type, and in which a $\lambda/4$ phase shifter is placed at an intermediate portion in a light traveling direction;

wherein a sectional shape of the current narrowing window in a direction perpendicular to the light traveling direction varies depending on the position in the light traveling direction so that, at a region in the light traveling direction where the $\lambda/4$ phase shifter is placed, a resistance of a current path from the second cladding layer of the second conductivity type to the first cladding layer of the second conductivity type through the current narrowing window is minimum.

A method of manufacturing an optical semiconductor device disclosed in this application is characterized by comprising: a step of forming a stacked structure by stacking a cladding layer of a first conductivity type, an active layer, and a first cladding layer of a second conductivity type as an opposite conductivity type to the first conductivity type, in this order, on a surface of a substrate of the first conductivity type; a step of etching both side portions of the stacked structure up to a position nearer to the substrate of the first conductivity type than to the active layer, to thereby form a ridge stripe; a step of burying, using a burying material doped with a semi-insulative material, respective both sides of the ridge stripe while leaving a top part of the ridge stripe exposed, to thereby form first burying layers; a step of forming a second burying layer of the first conductivity type while covering, with at least one mask, a middle portion of the top part of the ridge stripe except for both ends thereof so that the second burying layer has a current narrowing window where respective protruding portions of the second burying layer that are protruding from the first burying layers onto the top part of the ridge stripe are opposed to each other with an interval therebetween narrower than a width of the top part; and a step of forming, using a material of the second conductivity type, a second cladding layer of the second conductivity type under which the second burying layer of the first conductivity type is buried together with the current narrowing window;

wherein, in the step of forming the stacked structure, a diffraction grating in which a $\lambda/4$ phase shifter is placed at an intermediate portion in a light traveling direction, is formed in the cladding layer of the first conductivity type or the first cladding layer of the second conductivity type; and wherein, in the step of forming the second burying layer of the first conductivity type, at least one of a width and a use number of said at least one mask is changed depending on the position in the light traveling direction so that, at a region in the light traveling direction where the $\lambda/4$ phase shifter is placed, at least one of following conditions is satisfied: an opening width of the current narrowing window is maximum; and a thickness of the protruding portions of the second burying layer of the first conductivity type is minimum.

Effect of the Invention

According to the semiconductor laser device or the method of manufacturing the optical semiconductor device disclosed in this application, the resistance distribution is controlled by varying the shape. Thus, it is possible to provide an optical semiconductor device which is easily capable of stable operation without requiring complex operational control.

BRIEF DESCRIPTION OF THE DRAWINGS

FIG. 6A to FIG. 6D, FIG. 6E1 and FIG. 6E2 are sectional views in respective steps for illustrating a method of manufacturing the optical semiconductor device according to Embodiment 2.

MODES FOR CARRYING OUT THE INVENTION

Embodiment 1

Figure 1A:
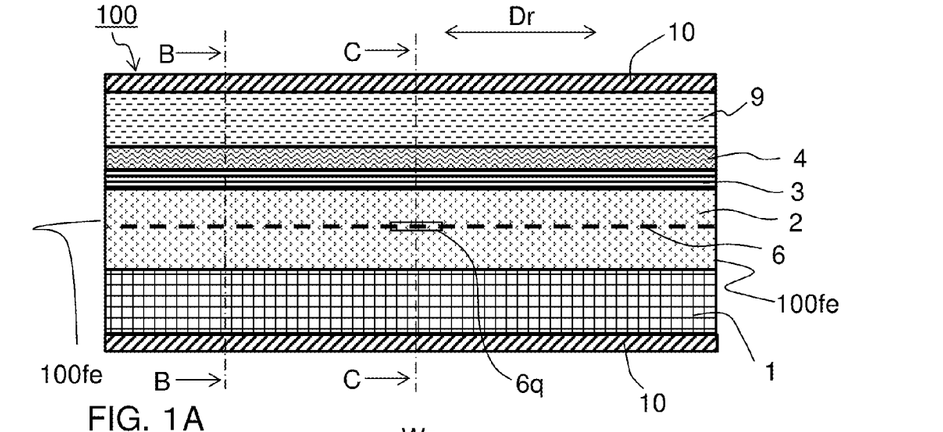
FIG. 1A to FIG. 1C are sectional views for illustrating a configuration of an optical semiconductor device according to Embodiment 1.

FIG. 1A to FIG. 4 are provided for illustrating an optical semiconductor device and a method of manufacturing the optical semiconductor device, according to Embodiment 1. FIG. 1A to FIG. 1C show sectional views for illustrating the configuration of the optical semiconductor device, in which FIG. 1A is a sectional view parallel to a light traveling direction and a stacking direction, at a ridge stripe portion (corresponding to a line A in FIG. 1B); FIG. 1B is a sectional view of the optical semiconductor device perpendicular to the light traveling direction, at a portion in the light traveling direction near an end face (corresponding to a line B-B in FIG. 1A); and FIG. 1C is a sectional view of the optical semiconductor device perpendicular to the light traveling direction, at a portion in the light traveling direction where a $\lambda/4$ phase shifter of the semiconductor device is formed (corresponding to a line C-C in FIG. 1A). Further, FIG. 2A to FIG. 2F are sectional views perpendicular to the light traveling direction (corresponding to FIG. 1B) in respective steps in the method of manufacturing the optical semiconductor device by using stacking, after the time when a ridge stripe is formed on an n-type substrate.

Figure 3:
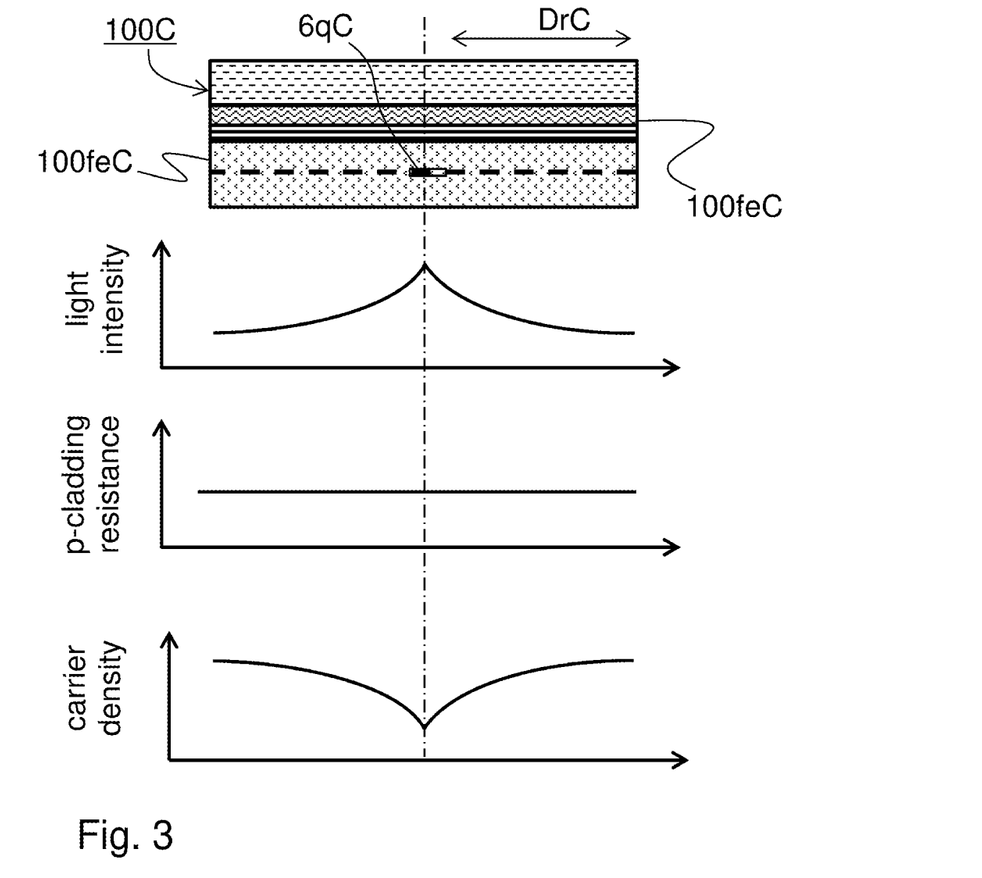
FIG. 3 is a characteristic diagram as a comparative example showing distributions of light intensity, p-cladding resistance and carrier density, each in a light traveling direction, in a conventional optical semiconductor device.
Figure 4:
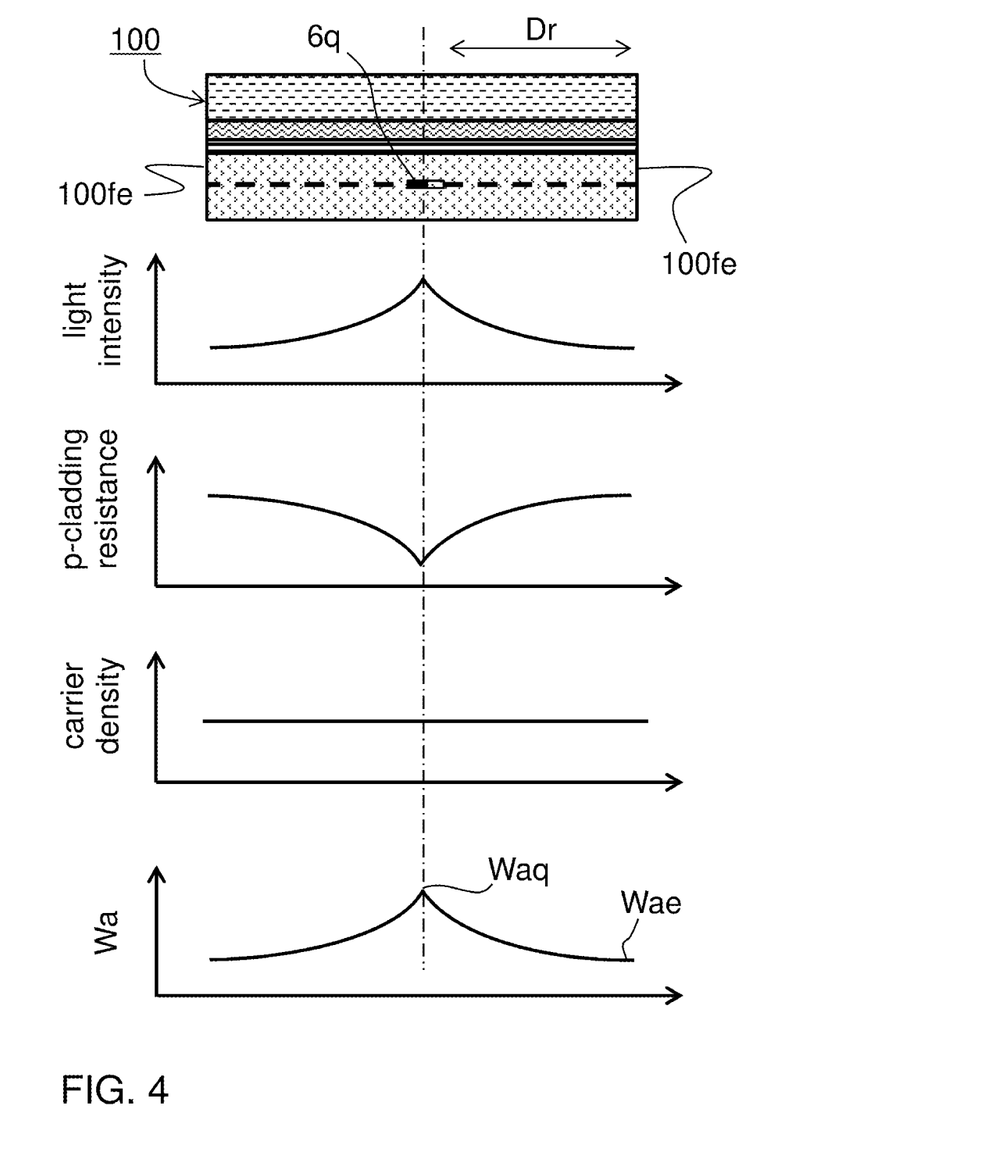
FIG. 4 is a characteristic diagram showing distributions of light intensity, p-cladding resistance, carrier density and opening width of a current narrowing window, each in the light traveling direction, in the optical semiconductor device according to Embodiment 1.

Further, FIG. 3 is a characteristic diagram as a comparative example conventional optical for illustrating characteristics of a semiconductor device, in which a light intensity distribution in an active layer, a p-cladding resistance distribution and a carrier density distribution, each in the light traveling direction and at the time of laser oscillation, are shown individually, together with a sectional perspective view corresponding to FIG. 1A. On the other hand, FIG. 4 is a characteristic diagram for illustrating characteristics of the optical semiconductor device according to Embodiment 1, in which a light intensity distribution in an active layer, a p-cladding resistance distribution, a carrier density distribution and a distribution of opening width of the current narrowing window for controlling the p-cladding resistance distribution, each in the light traveling direction and at the time of laser oscillation, are shown individually, together with a sectional perspective view corresponding to FIG. 1A. Note that when description is made about the conventional optical semiconductor device, with respect to its component that is equivalent to a component of the optical semiconductor device according to this embodiment, a symbol "C" is affixed to the end of the numeral to be given thereto, to thereby make a distinction between these components.

Figure 1B:
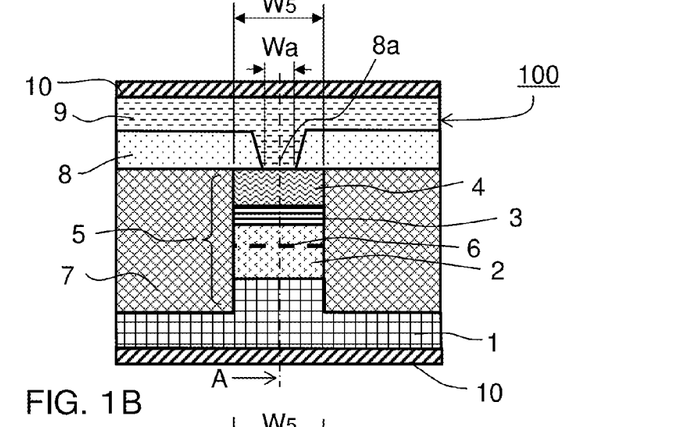
Figure 1C:
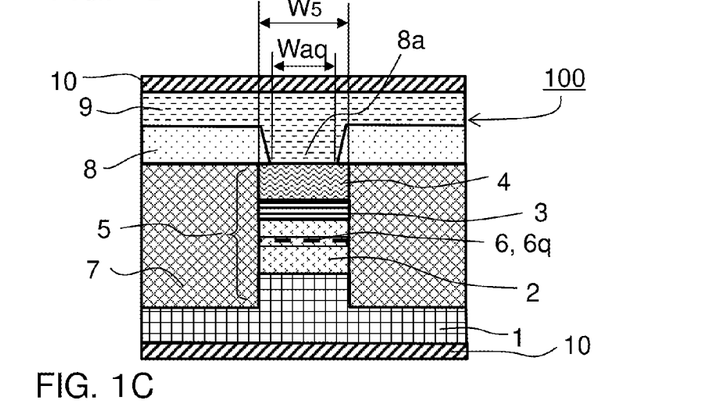

Hereinafter, description will be made about an optical semiconductor device and a method of manufacturing the optical semiconductor device, according to Embodiment 1 in this application, with reference to the drawings. As shown in FIG. 1A, an optical semiconductor device 100 is configured so that a stack of semiconductor layers that extends along a light traveling direction Dr is sandwiched by electrodes 10. As shown in FIG. 1B and FIG. 1C, on the lowermost face of the semiconductor layers, an n-type InP substrate 1 having (001) plane as a principal plane is placed. On this substrate, an n-type cladding layer 2, an active layer 3 including a multiple quantum well, and a 0.1 μm-thick p-type first cladding layer 4 made of InP, are stacked in this order, to thereby constitute a ridge stripe 5 that is also referred to as an active layer ridge.

In the n-type InP substrate 1, S (Sulfur) is doped in a concentration of $4.0 \times 10^{18}$ cm$^{-3}$, and in the n-type cladding layer 2, S is doped in a concentration of $4.0 \times 10^{18}$ cm$^{-3}$. The active layer 3 is formed of an AlGaInAs-based or InGaAsP-based material, and in the p-type first cladding layer 4, Zn (Zinc) is doped in a concentration of $1.0 \times 10^{18}$ cm$^{-3}$.

Further, in the n-type cladding layer 2, a diffraction grating 6 made of an InGaAsP-based material and having a thickness of 40 nm, a width of 100 nm and a period of about 200 nm is embedded, and as shown in FIG. 1A, a λ/4 phase shifter 6q is formed in a central portion in the light traveling direction Dr of the diffraction grating 6. Note that the diffraction grating 6 may be embedded in the p-type first cladding layer 4 not in the n-type cladding layer 2, and the λ/4 phase shifter 6q is not limited to being placed in the central portion and may be placed at any given position in the light traveling direction Dr.

The ridge stripe 5 is formed by etching the semiconductor layers stacked as described above, up to a position lower than the active layer 3, while leaving their central portion in the width direction (a direction perpendicular to the stacking direction and the light traveling direction Dr) unremoved. Accordingly, the cross-section of the n-type InP substrate 1 perpendicular to the light traveling direction Dr forms an inverted-T shape. Note that although a width $W_5$ of the ridge stripe 5 is generally about from 0.8 to 1.4 μm, it is not limited to in this range. The respective lateral sides of the ridge stripe 5 are buried up to a position higher than the active layer 3, by first burying layers 7 each made of InP that is doped with Fe as a semi-insulative material in a concentration of $5.0 \times 10^{16}$ cm$^{-3}$. The material of the first burying layer 7 is not limited to the above, and may be another semi-insulative material, such as InP that is doped with another material of Ti, Co, Ru or the like.

Further, the first burying layer 7 may be configured as a combination of different semiconductor layers which are different in impurity concentration or conductivity type. On the first burying layers 7, a 0.4 μm-thick n-type second burying layer 8 made of InP that is doped with S in a concentration of $7.0 \times 10^{18}$ cm$^{-3}$, is formed, and end portions in the n-type second burying layer 8 that are directed to the width-direction center thereof are protruding onto the upper face of the ridge stripe 5. The n-type second burying layer 8 and the ridge stripe 5 are buried under a p-type second cladding layer 9 made of InP that is doped with Zn in a concentration of $2.0 \times 10^{18}$ cm$^{-3}$. Furthermore, on the lower side of the n-type InP substrate 1 and on the upper side of the p-type second cladding layer 9, electrodes 10 each made of a metal, such as Au, Ge, Zn, Pt, Ti or the like, are formed.

On a width-direction central portion of the uppermost part (top part) of the ridge stripe 5 having the active layer 3, the n-type second burying layer 8 is open widthwise to thereby form a current narrowing window 8a that extends in the light traveling direction Dr, and the p-type first cladding layer 4 and the p-type second cladding layer 9 are in contact with each other through the current narrowing window 8a. An opening width Wa of the current narrowing window 8a is basically set to 0.7 μm, but is adjusted to vary along the light traveling direction Dr. Specifically, the current narrowing window 8a is configured so that its opening width Waq on a region where the λ/4 phase shifter 6q is placed, that is shown in FIG. 1C, is larger than the opening width Wa on another region, that is shown in FIG. 1B, and becomes maximum. Note that the basic opening width Wa of the current narrowing window 8a is generally about from 0.5 to 1.0 μm; however, it is not limited to in this range so far as it is narrower than the width of the ridge stripe 5 (precisely, the p-type first cladding layer 4).

In the optical semiconductor device 100 according to Embodiment 1, a front-end face 100fe and a rear-end face 100fe formed by cleavage, constitute a resonator. Emitted light obtained in the active layer 3, due to injection of a current, is amplified in the resonator resulting in laser oscillation. Although the length of the resonator is set to from 150 μm to 300 μm in many cases, it is not limited to in this range.

Figure 2A:
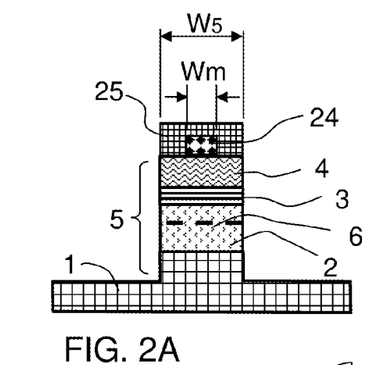
FIG. 2A to FIG. 2F are sectional views in respective steps for illustrating a method of manufacturing the optical semiconductor device according to Embodiment 1.

Next, one exemplary method of manufacturing the optical semiconductor device 100 according to Embodiment 1 will be described using FIG. 2. First, as shown in FIG. 2A, the n-type cladding layer 2 having the diffraction grating 6 embedded therein, the active layer 3 and the p-type first cladding layer 4 are stacked on the n-type InP substrate 1. Thereafter, a first mask 24 is formed which has a distribution of width Wm that is matched with the distribution of opening width Wa of the current narrowing window 8a along the light traveling direction, and then a second mask 25 is formed with a width that is same as the width $W_5$ of the ridge stripe 5 so as to cover the above mask. The first mask 24 uses a material whose etching rate is lower than that of the second mask 25. Further, the width Wm of the first mask 24 is narrower than the width $W_5$ of the second mask 25, and it is desired that the first mask 24 be placed centrally with respect to the second mask 25. Using such a double mask comprised of the first mask 24 and the second mask, etching is performed up to the position lower than the active layer 3, to thereby form the ridge stripe 5.

Figure 2B:
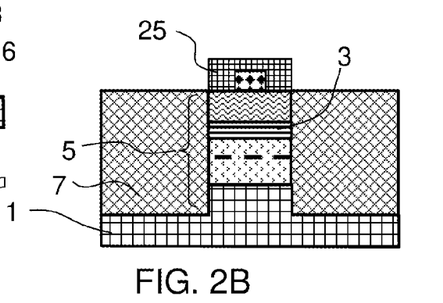
Figure 2C:
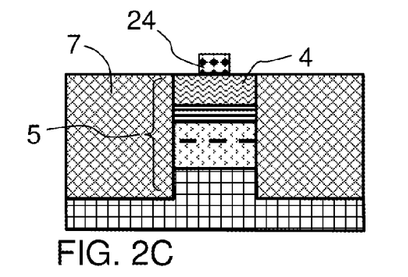

Then, as shown in FIG. 2B, both sides of the ridge stripe 5 are buried by the first burying layers 7 up to the position higher than the active layer 3. Thereafter, as shown in FIG. 2C, the second mask 25 is subjected to selective etching. For example, in the case where the material of the first mask 24 is $SiO_2$ and the material of the second mask 25 is SiN, when $SF_6$ is used as an etching gas, it is possible to etch only the second mask 25 selectively by making use of the difference between their etching rates.

Figure 2D:
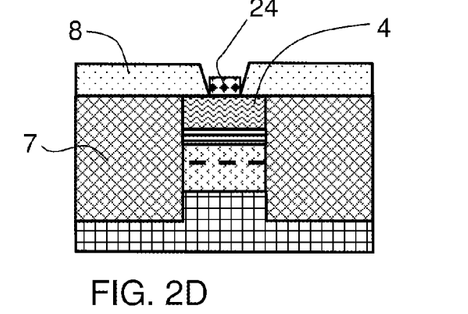
Figure 2E:
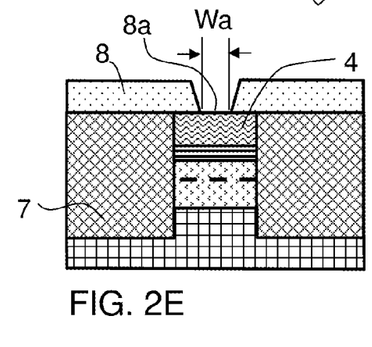
Figure 2F:
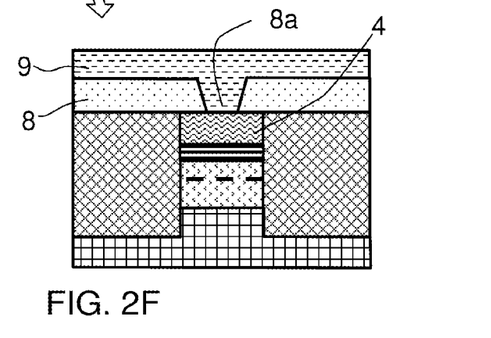

Then, as shown in FIG. 2D, the n-type second burying layer 8 is grown so as to bury the first burying layers 7 and the ridge stripe 5. Subsequently, after removing the first mask 24 by using buffered hydrofluoric acid or hydrofluoric acid as shown in FIG. 2E, the p-type second cladding layer 9 is grown so as to cover the first cladding layer 4 and the n-type second burying layer 8 as shown in FIG. 2F. Lastly, the electrodes 10 are formed on the lower side of the n-type InP substrate 1 and the upper side of the p-type second cladding layer 9, so that the optical semiconductor device 100 shown in FIG. 1 is configured.

When a current is injected into the thus-configured optical semiconductor device 100 through the upper and lower electrodes 10, electrons and holes are supplied, respectively, from the n-type InP substrate 1 and the n-type cladding layer 2 and from the p-type first cladding layer 4 and the p-type second cladding layer 9. The holes supplied from the p-type second cladding layer 9 flow out toward the n-type substrate 1. The holes are blocked by a potential barrier placed at the interface between the p-type second cladding layer 9 and the n-type second burying layer 8, and injected into the active layer 3 while passing the p-type first cladding layer 4 through the current narrowing window 8a. A resistance R of such a current-flow path is generally represented by a formula (1) under the assumption that the electrical resistivity is ρ, the sectional area of the path is S and the length of the path is L.

$$R = \rho(L/S)\ldots \quad (1)$$

The opening width Waq of the current narrowing window 8a near the center thereof in the light traveling direction Dr around which the λ/4 phase shifter 6q is placed, is larger than the opening width Wa at another region such as a region near the end face, or the like, resulting in a larger sectional area S. Accordingly, the resistance R becomes lower as represented by the formula (1), and this facilitates the injection of current.

In order to explain the characteristics of the optical semiconductor device 100 according to Embodiment 1 while taking the above-described configuration into consideration, the characteristics of an optical semiconductor device 100C having a conventional structure will be firstly described by using FIG. 3. In the light intensity distribution at the time laser oscillation in a usual single mode is established for the optical semiconductor device 100C, the intensity is strongest at the region where a λ/4 phase shifter 6qC is placed, and becomes weaker as the position becomes farther from the placement position of the λ/4 phase shifter 6qC. Thus, at the region in a light traveling direction DrC where the λ/4 phase shifter 6qC is placed and light density is high, stimulated emission is likely to occur as compared with the other region, so that the carrier density is relatively decreased.

It is herein noted that, in the conventional optical semiconductor device 100C, an opening width WaC of its current narrowing window 8aC is constant regardless of the position in the light traveling direction DrC, so that the p-cladding resistance distribution is uniform. Thus, holes are injected almost uniformly regardless of the position in the light traveling direction DrC, so that the carrier density around the placement position of the λ/4 phase shifter 6qC becomes lower, causing a phenomenon referred to as "longitudinal hole burning". This causes variation in refractive index in the light traveling direction DrC, so that the single mode operation becomes unstable.

On the other hand, even in the case of the optical semiconductor device 100 according to Embodiment 1, in the light intensity distribution at the time laser oscillation in a usual single mode is established, the intensity is strongest at the region where the λ/4 phase shifter 6q is placed, and becomes weaker as the position becomes farther from the placement position of the λ/4 phase shifter 6q. Thus, at the region in the light traveling direction Dr where the λ/4 phase shifter 6q is placed and light density is high, stimulated emission is likely to occur as compared with the other region, so that the carrier density is relatively decreased.

In that regard, in the optical semiconductor device 100 according to Embodiment 1, the opening width Wa of the current narrowing window 8a is varied along the light traveling direction Dr so that, at the region where the λ/4 phase shifter 6q is placed, the opening width Waq becomes largest as shown in the lowermost figure. Accordingly, the p-cladding resistance varies along the light traveling direction Dr so that it shows a minimum value at the region where the λ/4 phase shifter 6q is placed. Therefore, at the region in the light traveling direction Dr where the λ/4 phase shifter 6q is placed, holes are injected in a largest amount, so that the carrier density distribution along the positions in the light traveling direction Dr can be made uniform. Accordingly, the longitudinal hole burning is suppressed, thus making possible a stable single-mode operation.

It is noted that, with respect to the current narrowing window 8a in the optical semiconductor device 100 according to Embodiment 1, the opening width Wa is adjusted by dimensional designing (shape control) using usual semiconductor lithography for an element, to thereby cause the resistance to vary. According to the shape control, unlike material control, it is possible to easily realize highly-accurate manufacturing, so that, as shown in FIG. 4, it is possible to control the opening width Wa in a stepless manner along the light traveling direction Dr so as to make compensation for the distribution of light intensity. In this case, the opening width Waq at the region where the λ/4 phase shifter 6q is placed, is preferable to be in a range about from 1.2 to 2.4 times relative to a narrowest width Wce near the end face 100fe.

However, the distribution of the opening width Wa is not necessarily fitted completely to a curve that compensates the light intensity distribution. For example, if the opening width Wa is varied stepwise between the region where the λ/4 phase shifter 6q is placed and a region other than that, it is possible, at the region where the λ/4 phase shifter 6q is placed, to reduce stimulated emission that is otherwise excessive in comparison to the other region. Namely, it suffices to adjust the opening width Wa of the current narrowing window 8a so that the p-cladding resistance is varied to the extent that the longitudinal hole burning is suppressed. With the application of such shape control, complex operational control is also not required at the time of operating the optical semiconductor device after completion.

Embodiment 2

In Embodiment 1, a case has been shown where, in order to adjust the distribution of p-cladding resistance in the light traveling direction, the width of the current narrowing window is varied depending on the position in the light traveling direction. In Embodiment 2, a case will be described where a layer thickness at a current-narrowing window portion is varied depending on the position in the light traveling direction, to thereby adjust the distribution of p-cladding resistance in the light traveling direction.

Figure 5A:
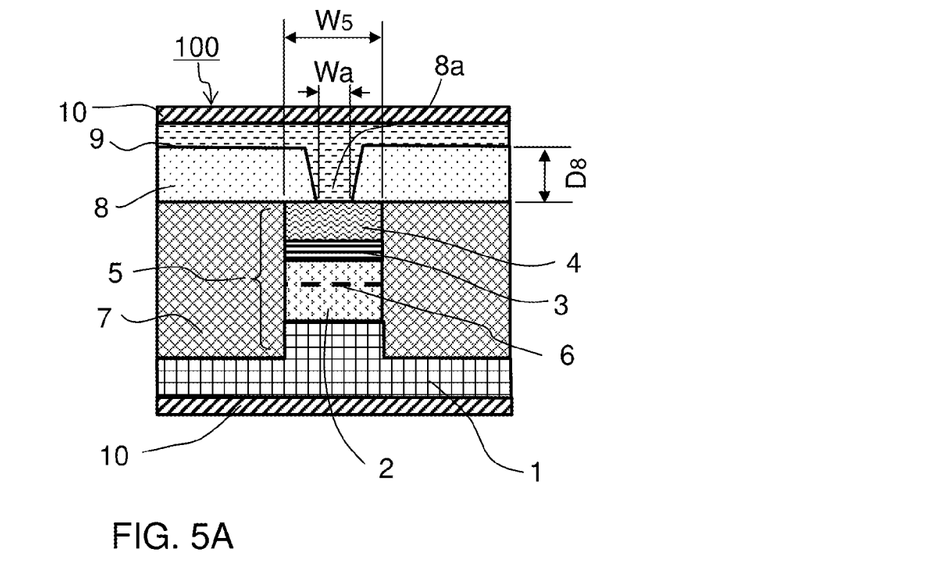
FIG. 5A and FIG. 5B are sectional views for illustrating a configuration of an optical semiconductor device according to Embodiment 2.
Figure 5B:
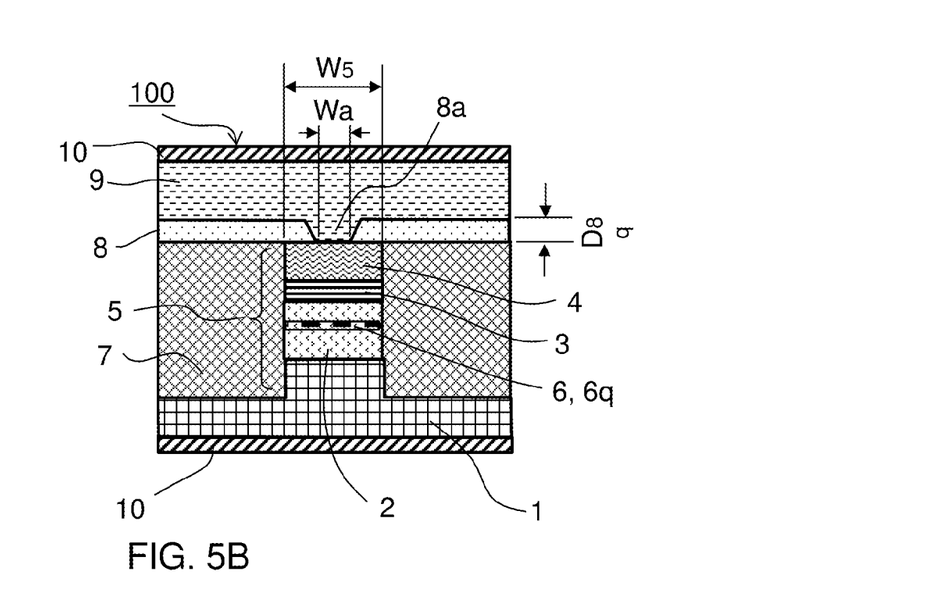

FIG. 5 and FIG. 6 are provided for illustrating an optical semiconductor device and a method of manufacturing the optical semiconductor device, according to Embodiment 2, and FIG. 5 shows sectional views for illustrating the configuration of the optical semiconductor device, in which FIG. 5A is a sectional view of the optical semiconductor device perpendicular to the light traveling direction, at a portion in the light traveling direction near an end face (corresponding to the line B-B in FIG. 1A); and FIG. 5B is a sectional view of the optical semiconductor device perpendicular to the light traveling direction, at a portion in the light traveling direction where a λ/4 phase shifter of the semiconductor device is formed (corresponding to the line C-C in FIG. 1A). Further, FIG. 6A to FIG. 6D, FIG. 6E1 and FIG. 6E2 are sectional views perpendicular to the light traveling direction (corresponding to FIG. 5A, FIG. 5B) in respective steps in the method of manufacturing the optical semiconductor device by using stacking, after the time when a ridge stripe is formed on an n-type substrate. Note that, for the parts similar to those in Embodiment 1, the same reference numerals are given, and description for the same specifications will be omitted.

Also in an optical semiconductor device 100 according to Embodiment 2, as shown in FIG. 5A and FIG. 5B, the ridge stripe 5 is configured in such a manner that the n-type cladding layer 2 having the diffraction grating 6 embedded therein, the active layer 3 and the p-type first cladding layer 4 are sequentially stacked on the n-type InP substrate 1. After being formed into a ridge shape, it is then buried by the first burying layers 7, the n-type second burying layer 8 and the p-type second cladding layer 9. Note also that the p-type second cladding layer 9 and the p-type first cladding layer 4 that constitutes the uppermost portion of the ridge stripe 5 are in contact with each other through the current narrowing window 8a sandwiched between portions of the n-type second burying layer 8. The configuration described so far is basically the same as in Embodiment 1.

Here, what is different from Embodiment 1 is that the n-type second burying layer 8 is configured so that its thickness $D_8q$ on a region shown in FIG. 5B where the $\lambda/4$ phase shifter 6q is placed, is thinner than its basic thickness $D_8$ set for another region shown in FIG. 5A, and is minimum. In this case, although the thickness $D_8$ of the n-type second burying layer 8 varies, the thickness of the p-type second cladding layer 9 at its portion covering over the current narrowing window 8a is constant in the light traveling direction Dr.

Figure 6A:
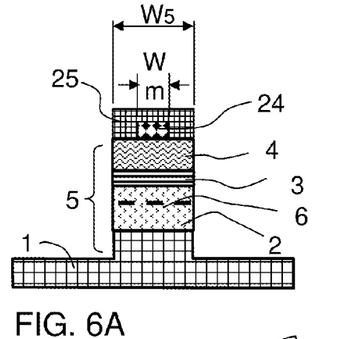
Figure 6B:
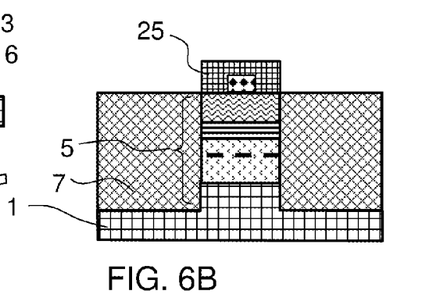
Figure 6C:
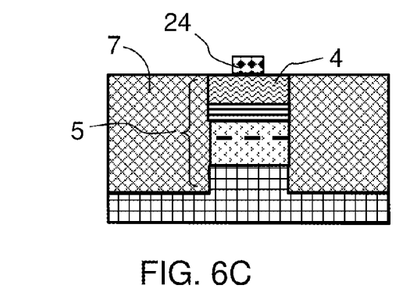
Figure 6D:
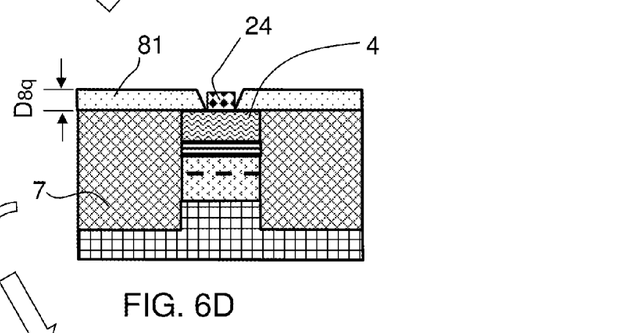

Next, a method of manufacturing the optical semiconductor device 100 according to Embodiment 2 will be described using FIG. 6A to FIG. 6D, FIG. 6E1 and FIG. 6E2. Note that the steps shown in FIG. 6A to FIG. 6D are the same as the steps shown in FIG. 2A to FIG. 2D described in Embodiment 1, so that description for the figures up to FIG. 6C will be omitted and the steps from FIG. 6D will be described. In Embodiment 1, the n-type second burying layer 8 is formed at once so as to bury the first burying layers 7 and the ridge stripe 5, whereas, in Embodiment 2, the n-type second burying layer 8 is formed by a plurality of separate processes (for example, two processes). First, as shown in FIG. 6D, a lower layer portion 81 of the n-type second burying layer 8 is grown up to the thickness $D_8q$ set for the region where the $\lambda/4$ phase shifter 6q is placed, regardless of the position in the light traveling direction Dr. Thereafter, other semiconductor layers are formed using different steps between the region where the $\lambda/4$ phase shifter 6q is placed and the region other than that (referred to as "the other region").

Figure 6E:
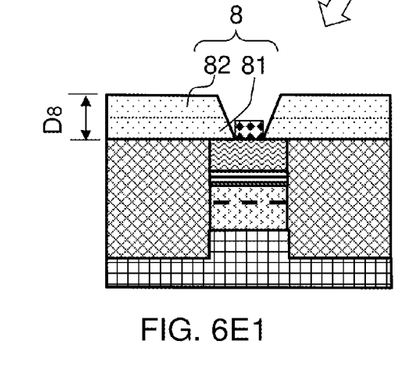
Figure 6E:
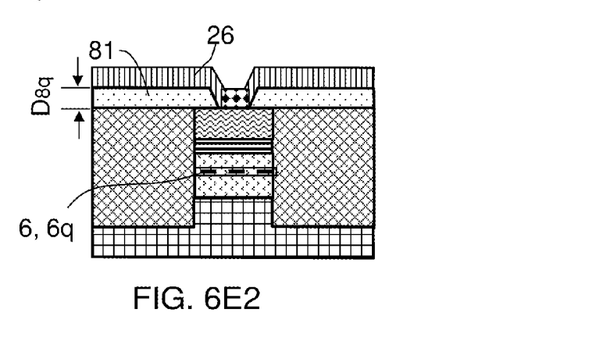

Specifically, for the other region, as shown in FIG. 6E1, an upper layer portion 82 of the n-type second burying layer 8 is grown successively on the lower layer portion 81 until a total thickness as the n-type second burying layer 8 reaches the specified thickness $D_8$. In contrast, for the region where the $\lambda/4$ phase shifter 6q is placed, as shown in FIG. 6E2, since a third mask 26 is formed on the lower layer portion 81, the upper layer portion 82 is not formed thereon, so that the thickness $D_8$ as the n-type second burying layer is equal to the thickness $D_8q$ of the lower layer portion 81.

Subsequently, after removing the first mask 24 and the third mask 26 by using buffered hydrofluoric acid or hydrofluoric acid, similarly to in the step described using FIG. 2F in Embodiment 1, the p-type second cladding layer 9 is grown so as to cover the first cladding layer 4 and the n-type second burying layer 8. Lastly, the electrodes 10 are formed respectively on the lower side of the n-type InP substrate 1 and on the upper side of the p-type second cladding layer 9. As the result, it is possible to configure the optical semiconductor device 100 in which, as shown in FIG. 5A and FIG. 5B, the thickness $D_8q$ of the n-type second burying layer 8 on the region where the $\lambda/4$ phase shifter 6q is placed, is thinner than the thickness $D_8$ thereof set for the other region, and is minimum.

As a result, as represented by FIG. 5A, FIG. 5B and the formula (1) described in Embodiment 1, the thickness $D_8q$ of the n-type second burying layer 8 at the region where the $\lambda/4$ phase shifter 6q is placed becomes thinner than the thickness at the other region, such as, near the end face 100fe or the like, causing the length L of the current path through the current narrowing window 8a to become shorter. Accordingly, like in FIG. 4, the resistance R at the region where the $\lambda/4$ phase shifter 6q is placed becomes lower, and this facilitates the injection of current into the active layer 3, so that it is possible to uniformize the carrier density distribution along the light traveling direction Dr. Accordingly, the longitudinal hole burning is suppressed, thus making possible a stable single-mode operation.

This effect is due to that the resistance is varied by adjustment of a shape (dimension), that is, a thickness distribution of the n-type second burying layer 8. Thus, unlike material control, it is possible to easily realize highly-accurate manufacturing and further, complex operational control is not required at the time of use, like in Embodiment 1.

It is noted that, in the above example, a case is shown where the n-type second burying layer 8 is formed separately of two layers, that is, the lower layer portion 81 and the upper layer portion 82; however, this is not limitative. For example, the n-type second burying layer 8 may be grown separately as three or more plural layers in such a manner that a portion to be covered by the third mask 26 (a region in the light traveling direction Dr) is enlarged step by step. Namely, when separate processes that are represented by FIG. 6E1 and FIG. 6E2 and depending on the position in the light traveling direction Dr, are repeated two or more times, it is also possible to elaborately vary the thickness $D_8$ of the n-type second burying layer 8 along the light traveling direction Dr. Note that such adjustment in thickness is not limited to being solely based on the difference in grown thickness. For example, it is also possible to fabricate that layer in such a manner that, after the change of the mask region in the light traveling direction Dr, the thickness is adjusted based on the degree of etching (thickness reduction amount).

On the other hand, in order to elaborately vary the thickness $D_8$ of the n-type second burying layer 8, the repeated number of processes will be increased regardless of whether based on growing or etching. Thus, in order to obtain an elaborate variation, it is more suitable to vary the opening width Wa of the current narrowing window. However, unlike the opening width Wa of the current narrowing window 8a, because of absence of such restriction by the width $W_5$ of the ridge stripe 5, it is more preferable to adjust the thickness $D_8$ in the case where it is desired to largely change the ratio between the resistance at the region where the $\lambda/4$ phase shifter 6q is placed and the resistance at the other region.

Embodiment 3

Figure 7A:
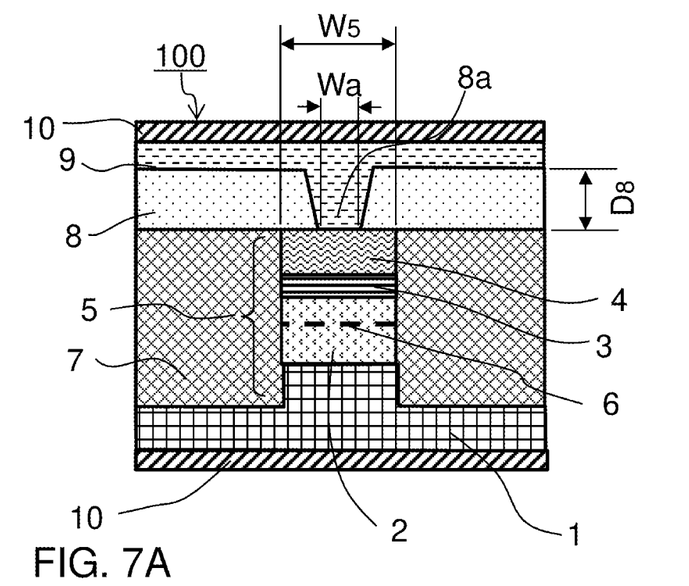
FIG. 7A and FIG. 7B are sectional views for illustrating a configuration of an optical semiconductor device according to Embodiment 3.
Figure 7B:
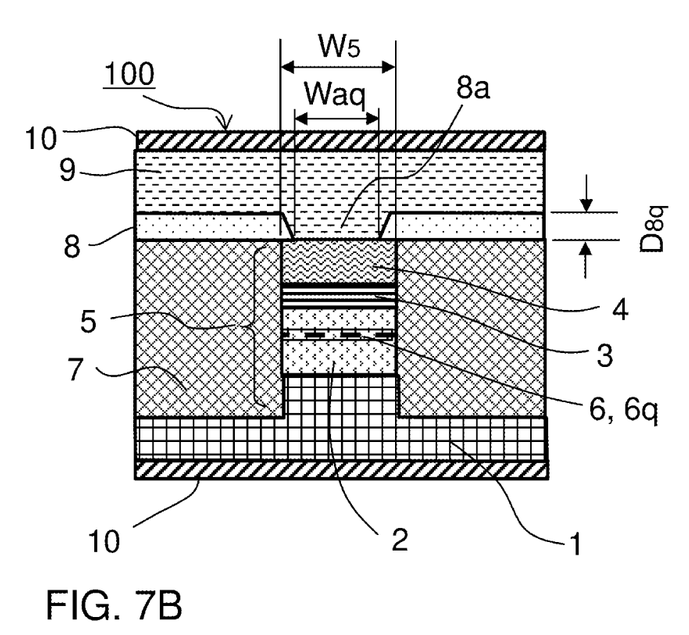
Figure 8:
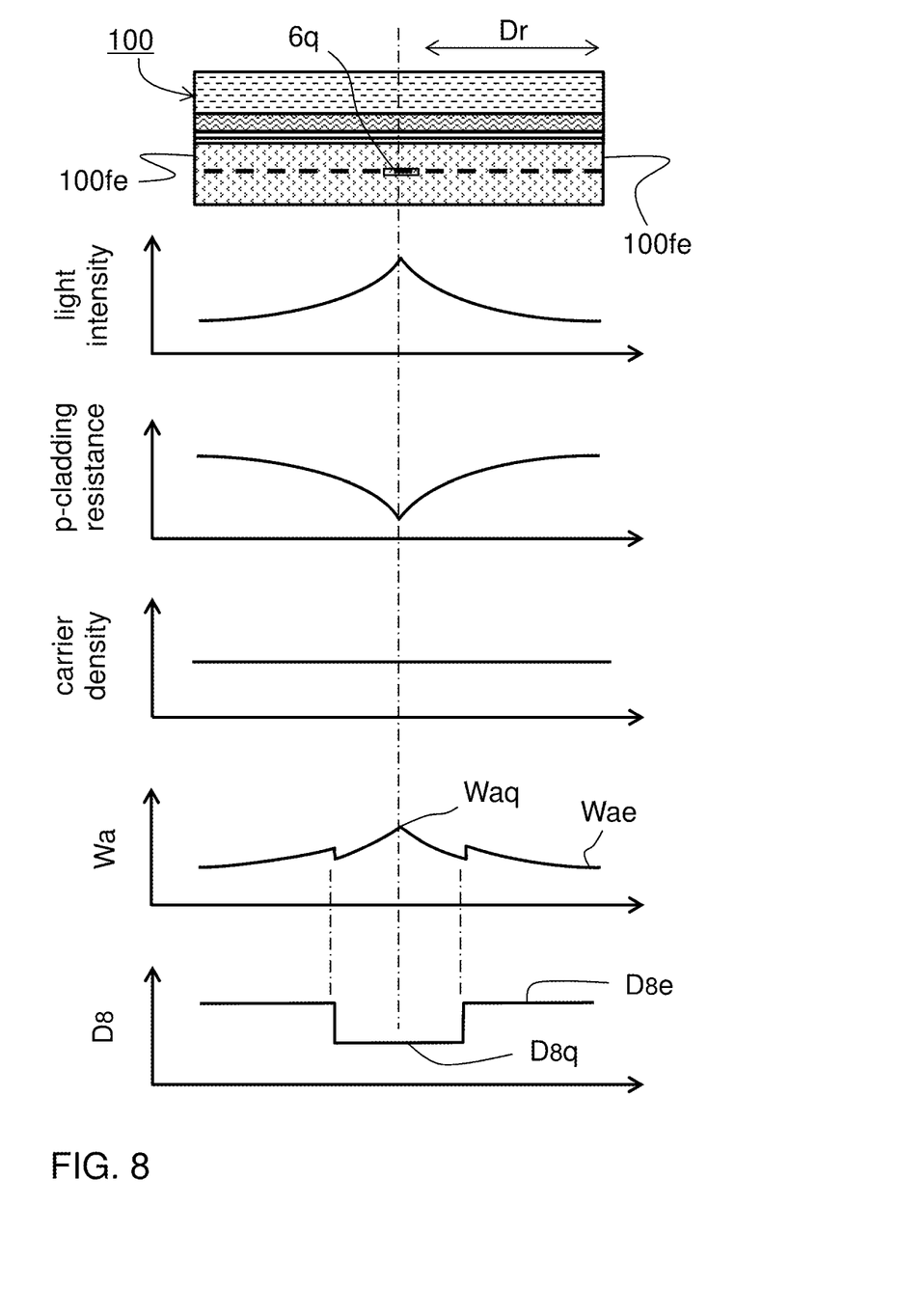
FIG. 8 is a characteristic diagram showing distributions of light intensity, p-cladding resistance, carrier density, width of a current narrowing window, and thickness of a burying layer, each in the light traveling direction, in the optical semiconductor device according to Embodiment 3.

In Embodiment 3, a case will be described which corresponds to a combination of Embodiments 1 and 2, and in which the distribution of p-cladding resistance in the light traveling direction is adjusted by making variations in both the width of the current narrowing window and the layer thickness at the current-narrowing window portion. FIG. 7A, FIG. 7B and FIG. 8 are provided for illustrating a configuration of an optical semiconductor device according to Embodiment 3, and FIG. 7 shows sectional views for illustrating the configuration of the optical semiconductor device, in which FIG. 7A is a sectional view of the optical semiconductor device perpendicular to the light traveling direction, at a portion in the light traveling direction near an end face (corresponding to the line B-B in FIG. 1A); and FIG. 7B is a sectional view of the optical semiconductor device perpendicular to the light traveling direction, at a portion in the light traveling direction where the λ/4 phase shifter of the semiconductor device is formed (corresponding to the line C-C in FIG. 1A).

Further, FIG. 8 is a characteristic diagram for illustrating characteristics of the optical semiconductor device according to Embodiment 3, in which a light intensity distribution in the active layer, a p-cladding resistance distribution, a carrier density distribution, a distribution of opening width of the current narrowing window for controlling the p-cladding resistance distribution and a thickness distribution of the n-type second burying layer, each in the light traveling direction at the time of laser oscillation, are shown individually, together with a sectional perspective view corresponding to FIG. 1A. Note that, for the parts similar to those in the foregoing Embodiment 1 or Embodiment 2, the same reference numerals are given, and description for the same specifications will be omitted.

While the feature of an optical semiconductor device 100 according to Embodiment 3 may be described on the basis of either Embodiment 1 or Embodiment 2, here, it will be described on the basis of Embodiment 2. In the optical semiconductor device 100 according to Embodiment 2, although the thickness $D_8$ of the n-type second burying layer 8 varies depending on the position in the light traveling direction Dr, the opening width Wa of the current narrowing window 8a is constant and remains the same regardless of the position in the light traveling direction Dr. However, as shown in FIG. 7A and FIG. 7B, the optical semiconductor device 100 according to Embodiment 3 is configured so that, in addition to the thickness $D_8$ of the n-type second burying layer 8, the opening width Wa of the current narrowing window 8a differs depending on the position in the light traveling direction Dr.

For example, as shown in FIG. 7B, on the region where the λ/4 phase shifter 6q is placed, the opening width Wa of the current narrowing window 8a becomes larger and the thickness $D_8$ of the n-type second burying layer 8 becomes thinner, in comparison to the other region, such as, near the end face 100fe or the like, represented by FIG. 7A. Accordingly, as described using the formula (1) in Embodiment 1, near the center in the light traveling direction Dr around which the λ/4 phase shifter 6q is placed, the length L of the current path through the current narrowing window 8a becomes shorter, so that the p-cladding resistance (resistance R) becomes lower as shown in FIG. 8. Furthermore, the width of the current narrowing window 8a becomes larger and thus the sectional area S becomes larger, so that the resistance R becomes much lower and this facilitates the injection of current.

Namely, by the semiconductor device 100 according to Embodiment 3, in addition to achieving an effect that is the same as the effect described in Embodiment 1 (Uniformization of the carrier density distribution described using FIG. 4, that is due to adjustment in p-cladding resistance distribution matched with the light intensity distribution), it becomes possible to control the p-cladding resistance over a broader range and in an elaborate manner, by changing together the length L of the path through the current narrowing window 8a and the sectional area S thereof. Namely, by combining the adjustment of the thickness $D_8$ that is favorable for enlarging the range and the adjustment of the opening width Wa that is favorable for elaborate control, it is possible to easily accomplish ideal adjustment of the resistance distribution in the light traveling direction Dr.

At that time, the opening width Wa and the thickness $D_8$ may be designed to show a monotonic decrease and a monotonic increase, respectively, both from the region where the λ/4 phase shifter 6q is placed, as a peak; however, the opening width Wa may be controlled so as to compensate a stepwise variation of the thickness $D_8$. For example, in FIG. 8 (the lowermost figure), the thickness $D_8$ varies in two steps so that the ratio between the thickness $D_8q$ at the region of the λ/4 phase shifter 6q and a thickness $D_8e$ at the other region may be largely changed in response to a change of the light intensity. In that case, when focusing on a direction directed from the center to the end face 100fe, at a portion where the thickness $D_8$ decreases abruptly, the resistance decreases non-continuously due to such a change of the thickness $D_8$.

Therefore, for example, at each portion in FIG. 8 where the thickness $D_8$ decreases abruptly (changes from $D_8e$ to $D_8q$), the opening width Wa may be adjusted to increase non-continuously in order to compensate the non-continuously decreasing resistance due to the change of the thickness $D_8$. Further, for the region where the thickness $D_8$ remains the same, the opening width Waq may be varied in a stepless manner. Accordingly, a wide resistance range can be established without unreasonably enlarging the ratio between the opening width Waq that is maximum and an opening width Wae that is minimum. In this case, the adjustment of the thickness $D_8$ is not limited to two-step adjustment and may, of course, be three or more-step adjustment.

In addition, the characteristics as described above can be achieved by resistance adjustment based on dimensional designing using semiconductor lithography and crystal growth for an element. Thus, it is possible to realize manufacturing in a well-controlled manner and further, complex operational control is not required at the time of operation.

It is noted that, in each of the foregoing Embodiments, the optical semiconductor device 100 using the n-type InP substrate 1 and the manufacturing method thereof have been described; however, the device may instead have a structure which uses a p-type InP substrate and in which the conductivity type of each of the semiconductor layers is reversed. Therefore, with respect to the conductivity types of p-type and n-type described in this application, one of them may be referred to as a first conductivity type while the other one may be referred to as a second conductivity type. Namely, the second conductivity type is an opposite conductivity type to the first conductivity type, so that if the first conductivity type is p-type, the second conductivity type is n-type, and if the first conductivity type is n-type, the second conductivity type is p-type. Accordingly, for example, the member described as the n-type InP substrate 1, the member described as the n-type cladding layer 2, the member described as the p-type first cladding layer 4 and the member described as the p-type second cladding layer 9, may be read as, a substrate of the first conductivity type, a cladding layer of the first conductivity type, a first cladding layer of the second conductivity type and a second cladding layer of the second conductivity type, respectively, without specifying the conductivity type and the material.

Furthermore, it should be noted that, in this application, a variety of exemplary embodiments and examples are described; however, every characteristic, configuration or function that is described in one or more embodiments, is not limited to being applied to a specific embodiment, and may be applied singularly or in any of various combinations thereof to another embodiment. Accordingly, an infinite number of modified examples that are not exemplified here are supposed within the technical scope disclosed in the present description. For example, such cases shall be included where at least one configuration element is modified; where any configuration element is added or omitted; and furthermore, where at least one configuration element is extracted and combined with a configuration element of another embodiment.

As described above, the optical semiconductor device 100 according to each of Embodiments, is configured to include: the ridge stripe 5 which includes a cladding layer of the first conductivity type (n-type cladding layer 2), the active layer 3, and a first cladding layer of the second conductivity type as an opposite conductivity type to the first conductivity type (p-type first cladding layer 4), that are stacked in this order on a surface of a substrate of the first conductivity type (for example, n-type InP substrate 1); the first burying layers 7 by which respective both sides (in the direction perpendicular to the light traveling direction Dr and the stacking direction) of the ridge stripe 5 are buried, while leaving the top part (topmost end in the stacking direction) of the ridge stripe 5 exposed; a second burying layer of the first conductivity type (n-type second burying layer 8) which covers the respective first burying layers 7 and has the current narrowing window 8a where portions of the second burying layer that are protruding onto the top part of the ridge stripe 5 are opposed to each other on the top part with an interval therebetween (opening width Wa); a second cladding layer of the second conductivity type (p-type second cladding layer 9) under which the n-type second burying layer 8 is buried together with the current narrowing window 8a; and the diffraction grating 6 which is formed in the n-type cladding layer 2 or the p-type first cladding layer 4, and in which the $\lambda/4$ phase shifter 6q is placed at an intermediate portion in the light traveling direction Dr;

wherein a sectional shape (opening width Wa, thickness $D_8$ or a combination thereof) of the current narrowing window 8a in a direction perpendicular to the light traveling direction Dr varies depending on a position in the light traveling direction Dr so that, at a region in the light traveling direction Dr where the $\lambda/4$ phase shifter 6q is placed, the resistance R of a current path from the p-type second cladding layer 9 to the p-type first cladding layer 4 through the current narrowing window 8a is minimum.

Thus, it is possible to easily provide an optical semiconductor device which is capable of stable operation because of reduction of imbalance in the carrier density, without requiring complex operational control.

In particular, when, as described in Embodiment 1, the current narrowing window 8a is configured so that its thickness Wa is maximum at the region in the light traveling direction Dr where the $\lambda/4$ phase shifter 6q is placed, it is possible to reduce imbalance in the carrier density by using elaborate control matched with the distribution of light intensity.

Instead, when, as described in Embodiment 2 or 3, the n-type second burying layer 8 is configured so that the thickness $D_8$ of its portions protruding onto the top part of the ridge stripe 5 is minimum at the region in the light traveling direction Dr where the $\lambda/4$ phase shifter 6q is placed, it is possible, even if a large ratio is provided between the maximum and minimum values of the light intensity, to reduce imbalance in the carrier density in a manner of compensating that ratio.

Further, when, at the region in the light traveling direction Dr where the $\lambda/4$ phase shifter 6q is placed, the resistance R of the current path is designed to fall in a range from five-twelfths to ten-twelfths (respective inverse numbers of 2.4 and 1.2) of the resistance R of the current path at the other region, it is possible to optimize optical semiconductor devices 100 of almost all types of specifications.

Further, as described above, the method of manufacturing the optical semiconductor device 100 according to each of Embodiments, is designed to include: a step of forming a stacked structure by stacking a cladding layer of the first conductivity type (n-type cladding layer 2), the active layer 3, and a first cladding layer of the second conductivity type as an opposite conductivity type to the first conductivity type (p-type first cladding layer 4), in this order, on a surface of a substrate of the first conductivity type (for example, n-type InP substrate 1); a step of etching both side portions of the stacked structure up to a position nearer to the n-type InP substrate 1 than to the active layer 3, to thereby form the ridge stripe 5; a step of burying, using a burying material doped with a semi-insulative material, respective both sides of the ridge stripe 5 while leaving the top part of the ridge stripe 5 exposed, to thereby form the first burying layers 7; a step of forming a second burying layer of the first conductivity type (n-type second burying layer 8) while covering, with at least one mask (first mask 24 or third mask 26), a middle portion of the top part of the ridge stripe 5 except for both ends thereof so that the second burying layer has the current narrowing window 8a where respective protruding portions of the second burying layer that are protruding from the first burying layers 7 onto the top part of the ridge stripe 5 are opposed to each other with an interval therebetween (opening width Wa); and a step of forming, using a material of the second conductivity type (p-type), a second cladding layer of the second conductivity type (p-type second cladding layer 9) under which the n-type second burying layer 8 is buried together with the current narrowing window 8a;

wherein, in the step of forming the stacked structure, the diffraction grating 6 in which the $\lambda/4$ phase shifter 6q is placed at an intermediate portion in the light traveling direction Dr, is formed in the n-type cladding layer 2 or the p-type first cladding layer 4; and wherein, in the step of forming the second burying layer of the first conductivity type, at least one of the width and the use number of said at least one mask is changed depending on a position in the light traveling direction Dr so that, at the region in the light traveling direction Dr where the $\lambda/4$ phase shifter 6q is placed, at least one of the following conditions is satisfied: the opening width Wa of the current narrowing window 8a is maximum; and the thickness $D_8$ of the portions of the n-type second burying layer 8 protruding onto the top part of the ridge stripe 5 is minimum.

Thus, a sectional shape in line with the light traveling direction Dr can be easily formed as designed, so that it is possible to easily provide an optical semiconductor device which is capable of stable operation because of reduction of imbalance in the carrier density, without requiring complex operational control.

DESCRIPTION OF REFERENCE NUMERALS AND SIGNS

1: n-type InP substrate (substrate of the first conductivity type), 2: n-type cladding layer (cladding layer of the first conductivity type), 3: active layer, 4: p-type first cladding layer (first cladding layer of the second conductivity type), 5: ridge stripe, 6: diffraction grating, 6q: $\lambda/4$ phase shifter, 7:

first burying layer, 8: n-type second burying layer (second burying layer of the first conductivity type), 8a: current narrowing window, 9: p-type second cladding layer (second cladding layer of the second conductivity type), 10: electrode, 24: first mask (mask), 25: second mask, 26: third mask (mask), 100: optical semiconductor device, 100fe: end face, $D_8$: thickness, Dr: light traveling direction, R: resistance, Wa: opening width.

The invention claimed is:

1. An optical semiconductor device, comprising:
   a ridge stripe which includes a cladding layer of a first conductivity type, an active layer, and a first cladding layer of a second conductivity type as an opposite conductivity type to the first conductivity type, that are stacked in this order on a surface of a substrate of the first conductivity type;
   first burying layers by which respective both sides of the ridge stripe are buried while leaving a top part of the ridge stripe exposed;
   a second burying layer of the first conductivity type which covers the respective first burying layers and has a current narrowing window where portions of the second burying layer that are protruding onto the top part of the ridge stripe are opposed to each other on the top part with an interval therebetween narrower than a width of the top part;
   a second cladding layer of the second conductivity type under which the second burying layer of the first conductivity type is buried together with the current narrowing window; and
   a diffraction grating which is formed in the cladding layer of the first conductivity type or the first cladding layer of the second conductivity type, and in which a $\lambda/4$ phase shifter is placed at an intermediate portion in a light traveling direction;
   wherein a sectional shape of the current narrowing window in a direction perpendicular to the light traveling direction varies depending on a position in the light traveling direction so as to satisfy the conditions that the opening width of the current narrowing window is wider in the region where the $\lambda/4$ phase shifter is placed than in an end face region, and the thickness of protruding portion of the second burying layer of the first conductivity type in the light traveling direction is thinner in the region where the $\lambda/4$ phase shifter is placed than in the end face region, so that, at a region in the light traveling direction where the $\lambda/4$ phase shifter is placed, a resistance of a current path from the second cladding layer of the second conductivity type to the first cladding layer of the second conductivity type through the current narrowing window is minimum.

2. The optical semiconductor device of claim 1, wherein, at the region in the light traveling direction where the $\lambda/4$ phase shifter is placed, an opening width of the current narrowing window is maximum.

3. The optical semiconductor device of claim 1, wherein, at the region in the light traveling direction where the $\lambda/4$ phase shifter is placed, a thickness of the portions of the second burying layer of the first conductivity type that are protruding onto the top part is minimum.

4. The optical semiconductor device of claim 2, wherein, at the region in the light traveling direction where the $\lambda/4$ phase shifter is placed, a thickness of the portions of the second burying layer of the first conductivity type that are protruding onto the top part is minimum.

5. The optical semiconductor device of claim 1, wherein the resistance of the current path at the region in the light traveling direction where the $\lambda/4$ phase shifter is placed, falls in a range from five-twelfths to ten-twelfths of the resistance of the current path at another region.

6. The optical semiconductor device of claim 2, wherein the resistance of the current path at the region in the light traveling direction where the $\lambda/4$ phase shifter is placed, falls in a range from five-twelfths to ten-twelfths of the resistance of the current path at another region.

7. The optical semiconductor device of claim 3, wherein the resistance of the current path at the region in the light traveling direction where the $\lambda/4$ phase shifter is placed, falls in a range from five-twelfths to ten-twelfths of the resistance of the current path at another region.

8. The optical semiconductor device of claim 4, wherein the resistance of the current path at the region in the light traveling direction where the $\lambda/4$ phase shifter is placed, falls in a range from five-twelfths to ten-twelfths of the resistance of the current path at another region.

\* \* \* \* \*